United States Patent [19]
Merryman et al.

[11] Patent Number: 5,940,604
[45] Date of Patent: Aug. 17, 1999

[54] METHOD AND APPARATUS FOR MONITORING THE PERFORMANCE OF A CIRCUIT OPTIMIZATION TOOL

[75] Inventors: Kenneth E. Merryman, Fridley; Kevin C. Cleereman, Moundsview, both of Minn.

[73] Assignee: Unisys Corporation, Blue Bell, Pa.

[21] Appl. No.: 08/752,621

[22] Filed: Nov. 19, 1996

[51] Int. Cl.[6] .................................................. G06F 17/50
[52] U.S. Cl. ........................................................ 395/500.03
[58] Field of Search .................................... 364/488, 489, 364/490, 491, 578, 468.15

[56] References Cited

U.S. PATENT DOCUMENTS

| | | | |
|---|---|---|---|
| 4,300,196 | 11/1981 | Lopresti | 364/489 |
| 4,901,242 | 2/1990 | Kotan | 364/468 |
| 5,105,362 | 4/1992 | Kotani | 364/468 |
| 5,111,404 | 5/1992 | Kotani | 364/468 |
| 5,220,512 | 6/1993 | Watkins et al. | 364/489 |
| 5,225,998 | 7/1993 | Singhal | 364/554 |
| 5,475,695 | 12/1995 | Caywood et al. | 371/27 |
| 5,528,510 | 6/1996 | Kraft | 364/488 |
| 5,539,652 | 7/1996 | Tegethoff | 364/490 |
| 5,544,067 | 8/1996 | Rostoker et al. | 364/489 |
| 5,691,895 | 11/1997 | Kurtzberg et al. | 364/148 |
| 5,710,700 | 1/1998 | Kurtzberg et al. | 364/149 |
| 5,719,796 | 2/1998 | Chen | 364/578 |
| 5,751,582 | 5/1998 | Saxena et al. | 364/468.16 |

*Primary Examiner*—James P. Trammell
*Assistant Examiner*—Leigh Marie Garbowski
*Attorney, Agent, or Firm*—Charles A. Johnson; Mark T. Starr; Nawrocki, Rooney and Sivertson, P.A.

[57] ABSTRACT

A method and apparatus for monitoring the performance of a circuit optimization tool. The present invention contemplates inserting a number of performance monitoring commands into selected ones of a number of optimization scripts, wherein selected ones of the performance monitoring commands provide a number of performance related results when executed. Thereafter, the number of optimization scripts may be executed to optimize the circuit design. The number of results provided by the performance monitoring commands may then be assembled and analyzed by the circuit designer to identify any performance related problems.

37 Claims, 17 Drawing Sheets

EXEMPLARY RESULTS FILE ENTRY

270

DATE=YYMMDD_HHMMSS ASIC=ASIC_NAME PASS=PASS_DEF_STR DESIGN=ROOT_NAME PHASE=PROCESS_PHASE_STR RID=RID

EXEMPLARY RESULTS FILE

272

| | | | | | |
|---|---|---|---|---|---|
| DATE=DATE-A | ASIC=ASIC-1 | PASS=A | PHASE=OPTIMIZATION-START-PHASE-A | DESIGN=MODULE-E | RID=RID-A |
| DATE=DATE-B | ASIC=ASIC-1 | PASS=A | PHASE=CHARACTERIZATION-END-PHASE-C | DESIGN=MODULE-F | RID=RID-A |
| | ● ● ● | | | ● ● ● | |
| DATE=DATE-C | ASIC=ASIC-2 | PASS=B | PHASE=COLLECTION-START-PHASE-B | DESIGN=MODULE-A | RID=RID-B |

METHOD AND APPARATUS FOR MONITORING THE PERFORMANCE OF A CIRCUIT OPTIMIZATION TOOL

CROSS REFERENCE TO CO-PENDING APPLICATIONS

The present application is related to U.S. patent application Ser. No. 08/524,017, filed Aug. 29, 1995, entitled "A Method of Stabilizing Component and Net Names of Integrated Circuits In Electronic Design Automation Systems", U.S. patent application Ser. No. 08/72,620, filed Nov. 19, 1996, entitled "Method and Apparatus for Optimizing a Gated Clock Structure Using a Standard Optimization Tool", U.S. patent application Ser. No. 08/752,617, filed Nov. 19, 1996, entitled "Method and Apparatus for Incrementally Optimizing a Circuit Design", U.S. patent application Ser. No. 08/752,619, filed Nov. 19, 1996, entitled "Method and Apparatus For Providing Optimization Parameters to a Logic Optimizer Tool", U.S. patent application Ser. No. 08/752,616, filed Nov. 19, 1996, entitled "Method and Apparatus for Identifying Gated Clocks Within a Circuit Design Using a Standard Optimization Tool", U.S. patent application Ser. No. 08/752,618, filed Nov. 19, 1996, entitled "Method and Apparatus for Optimizing a Circuit Design Having Multi-cycle Clocks Therein", all assigned to the assignee of the present invention, and all incorporated herein by reference.

BACKGROUND OF THE INVENTION

1. Field of the Invention

This invention relates generally to electronic design automation (EDA) systems used for designing integrated circuits. The invention is more specifically related to a method and apparatus for monitoring the performance of a circuit optimization tool.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchial design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. The resulting design is often called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Typically, the logic design synthesis software is executed many times during the integrated circuit design process, because errors may be detected during the simulation and testing phases of the design cycle and then fixed in the behavioral description.

The output of the design capture and synthesis tools is typically a logic design database which completely specifies the logical and functional relationships among the components of the design. Once the design has been converted into this form, it may be optimized by sending the logic design database to a logic optimizer tool typically implemented in software.

In many logic optimizer tools, the optimization process may include a characterization step, an optimization step, and a collection step. During the characterization step, various optimization parameters are assigned to selected portions of the design. For example, for those portions of the design that are to be optimized for timing, the characterization step may perform a timing analysis of the design, and identify critical paths within the design that need to be improved by optimization. The characterization step may then assign timing constraints to those portions of the design, indicating the degree that they must be optimized to meet the desired timing goals. Because of the size of many designs, the characterization step typically may only operate on one module of the design at any given time. As such, the characterization step may assign timing constraints to the selected module, based upon the circuitry interfacing therewith. The module that the tools is currently operating on may be termed the local or selected module, while all other modules may be termed remote modules.

After the characterization step is complete, the optimizer tool may perform an optimization step. The optimization step typically attempts to optimize the design such that all of the timing constraints assigned by the characterization step are satisfied. During the optimization step, the logic optimizer may, for example, remove logic from the design that is unnecessary, minimize the logic that is necessary to implement certain functions, increase the power of selected cells to improve performance, etc. Like the characterization step, the optimization step typically may only operate on one module of the design at any given time.

After all of the modules within the circuit design have been optimized, a collection step is typically executed. The collection step may collect the various optimized modules, and write the optimized modules into a single design file.

After the design has been optimized, the circuit designer typically verifies that the resulting logic definition is correct and that the integrated circuit implements the expected function. This verification is currently achieved by timing and simulation software tools. That is, the design is simulated to assess the functionality and timing of the design. If timing errors are found or the resulting functionality, is unacceptable, the designer modifies the behavior description as needed. This may help to ensure that the design satisfies the desired requirements.

After timing verifications and functional simulation have been completed, placement and routing of the design's components is performed. These steps involve allocating components of the design to locations on the integrated circuit chip and interconnecting the components to form nets. Finally, final timing verification is performed after placement and routing is complete.

A limitation of typical logic optimizer tools is that the performance of the optimization process cannot be monitored by the circuit designer. Often a small subset of the circuit modules may consume an inordinate amount of processing time to characterize and/or optimize. More particularly, certain characterization and/or optimization commands or steps may consume an inordinate amount of processing time. This may be caused for any number of reasons. For example, modules that have a large number of hierarchical levels can take much more processing time than modules that have less levels of hierarchy, and the bulk of the processing time may be consumed performing one specific characterization and/or optimization task.

Often there are ways to circumvent performance related problems once brought to the attention of the circuit designer. However, because typical logic optimizer tools do not provide a way to monitor the performance of the circuit optimization process, the performance related problems may not be detected, and thus corrected. This may substantially increase the overall time and cost required to perform the circuit optimization process, particularly for large circuit designs.

SUMMARY OF THE INVENTION

The present invention overcomes many of the disadvantages of the prior art by providing a method and apparatus for monitoring the performance of a circuit optimizer tool. Typically, a circuit optimization tool executes a number of optimization scripts to optimize a circuit design. The optimization scripts typically include a number of sequentially executed optimization commands for optimizing the circuit design. The present invention contemplates inserting a number of performance monitoring commands into selected ones of the number of optimization scripts, wherein selected ones of the performance monitoring commands provide a number of performance related results when executed. Thereafter, the number of optimization scripts may be executed to optimize the circuit design. The number of results provided by the performance monitoring commands may then be assembled and analyzed by the circuit designer to identify any performance related problems.

In a preferred embodiment, the performance monitoring commands may provide a date stamp when executed, and thus specific tasks within the optimization process may be time stamped. This may enable the circuit designer to determine the relative processing time of pre-identified portions of the optimization scripts. The optimization scripts may include a characterization script, an optimization script and/or a collection script.

In one embodiment of the present invention, the optimization commands in the optimization scripts may be grouped into a number of optimization phases. In a preferred embodiment, at least one of the performance monitoring commands may be inserted substantially at the beginning of a selected one of the number of phases and at least one of the performance monitoring commands may be inserted substantially at the end of a selected one of the number of phases. Accordingly, the inserted performance monitoring commands may time stamp the beginning and end of each phase of the optimization scripts. This information may then be provided to results file. This may allow the circuit designer to calculate the elapse time for each phase of the optimization process.

In addition to providing a date stamp, the performance monitoring commands may store other information that may be useful to the circuit designer. For example, the performance monitoring commands may identify the corresponding module, the corresponding phase, a revision control number, a run identification, etc. This information may be stored as a number of fields in an entry in the results file.

As indicated above, the various modules within a circuit design are typically optimized separately, particularly for large designs. Thus, to decrease the real time required to optimize the overall circuit design, it is common to use a number of data processing systems in parallel, wherein each of the data processing systems may optimize one or more of the circuit modules. This may effectively allow the modules to be processed in parallel, thereby substantially increasing the speed at which the overall design may be optimized.

In an exemplary embodiment of the present invention, the number of data processing systems may be engineering workstations connected in a network configuration via a LAN or the like. In such a network, each of the data processing systems may store the corresponding results to a single results file. This may allow all of the results generated throughout the network to be stored in a single location, rather than scattered throughout the network.

In this configuration, the order of the entries in the results file may not correspond to the order in which a design would logically be optimized. For example, the first entry in the results file may correspond to the end of a phase in the characterization run of a particular module in a first circuit design, whereas the next entry may correspond to the start of a phase in an optimization run of a particular module in a completely separate circuit design. Even for the same circuit design, the results for different phases and for the various modules may not be in any logical order, but rather may be in the order that they were processed by the number of data processing system. Generally, however, the results file contains all of the entries and the entries are in order relative to other entries in a corresponding run.

The present invention contemplates providing an assembling capability for assembling selected entries from the results file. In a preferred embodiment, the circuit designer may select which phase, module, design or other field that is desired, and a search capability may search the result file and select those entries that have field values that match the selected fields. The assembling capability may then provide those entries to an output file for later review or processing. In addition, it is contemplated that the assembling capability may sort the results file in accordance with the selected fields.

Further, it is contemplated that the assembling capability may determine the elapse processing time for each of the selected phases. For example, the assembling capability may subtract the start time and the end time for each selected phase reported in the results file, and may record the result as an elapse processing time in the output file.

Finally, it is contemplated that the assembling capability may include a display capability for displaying the selected results in a user friendly way. For example, the assembling capability may write the output file in a CSV format. The CSV format is an industry-standard format used by programs such as Harvard Graphics™ and Excel™ to express data tables. As such, these programs may be used to graph or otherwise display the selected result. For example, Excel may graph the elapse time vs. the corresponding phase, or elapse time vs. the corresponding module. This may provide a visual basis for easily determining which portions of the optimization process are using an inordinate amount of processing time, and thus may provide a way to monitor the performance of the circuit optimization process. If performance related problems are detected, the circuit designer may circumvent the problems during the next design iteration. This may substantially decrease the overall time and cost required for performing the circuit optimization process, particularly for large circuit designs.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 10 is a table showing the entries and fields of an exemplary results file;

DETAILED DESCRIPTION OF THE PREFERRED EMBODIMENTS

Figure 1:
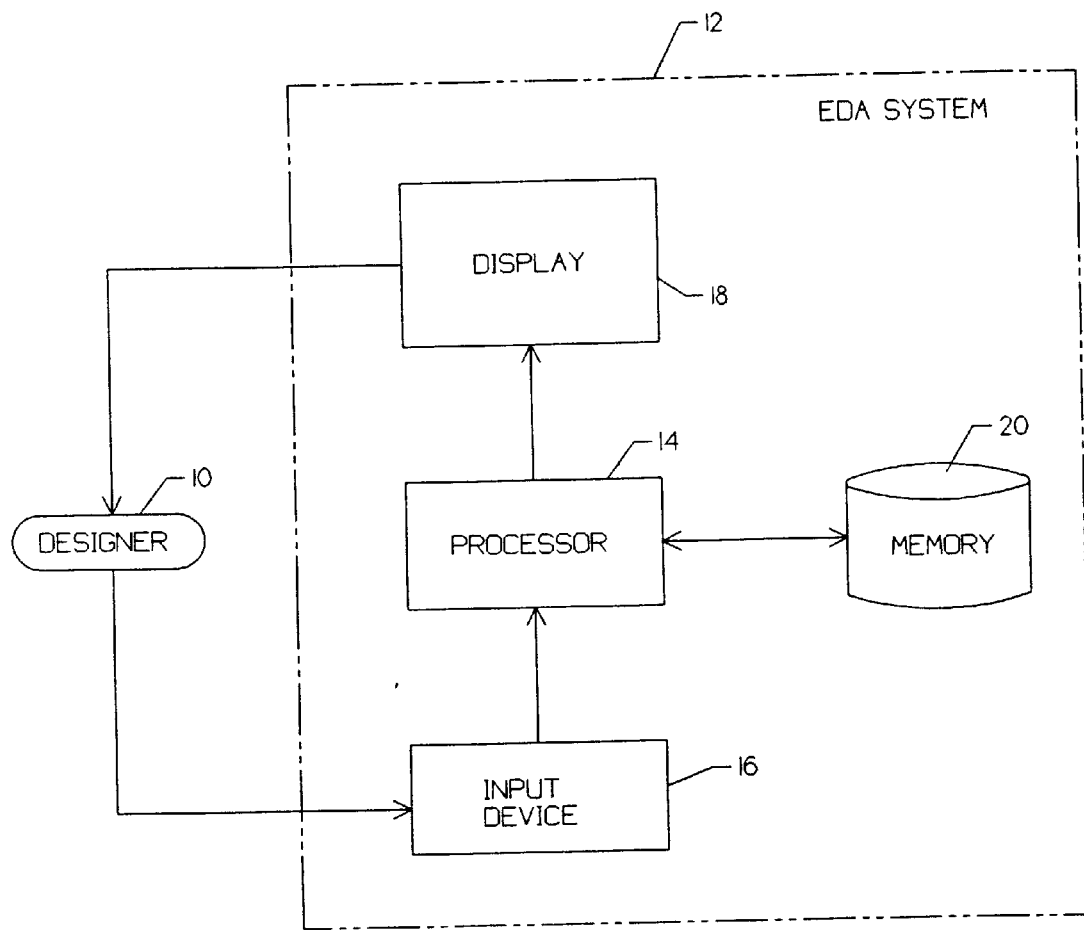
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an Electronic Design Automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
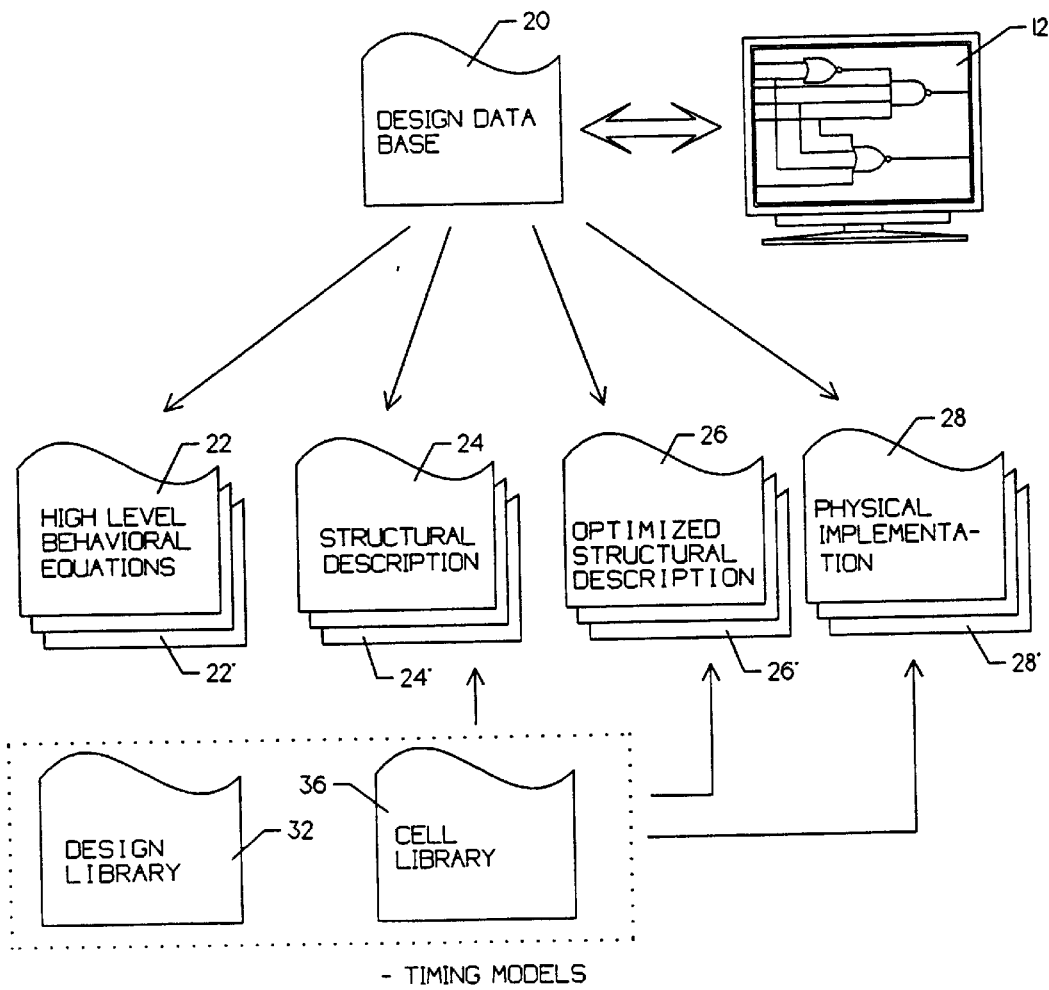
FIG. 2 is a block diagram showing typical circuit representations stored within a circuit design database.

FIG. 2 is a block diagram showing a number of circuit representations stored within a typical circuit design database. The design database 20 may include a high level behavioral representation 22, a structural description representation 24, an optimized structural representation 26, and a physical representation 28. Further, the database may include previous revisions of the high level behavioral representation 22', a structural description representation 24', an optimized structural representation 26', and a physical representation 28'.

As indicated above, the circuit designer typically specifies the logic design of an integrated circuit by using design capture software that runs on an EDA system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 may map to functional components of the design. In the preferred embodiment, the high level behavior description representation 22 is written in a design language called Universal Design Source Language (UDSL), although other existing, well-known hardware design languages could also be used.

The high level behavior description representation 22 may be input to a logic design synthesis tool. The logic design synthesis tool may assign the gates and other circuitry needed to implement the functions specified by the high level behavior description representation 22. In the preferred embodiment, the synthesis software is the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural description representation 24, which is sometimes referred to as the netlist for the design. This file contains the gate-level definition of the logic design. The structural description representation 24 may be in the Prime Behavior Description Language ('BDL), a format developed and used by the Unisys Corporation.

The structural description representation 24 may be provided to other EDA software programs, including an optimization program. The circuit optimization program may read the structural description representation 24 and optimize the logic represented therein. Typically, the optimization tool may read and write Electronic Data Interchange Format (EDIF) files. The EDIF format is an industry standard format for hardware design language information. Thus, embedded within a typical optimization program is an EDIF reader and an EDIF writer. The EDIF writer and reader translate the circuit design database 20 from an internal format to and from the EDIF format.

The optimization methodology used by the optimization program may be selectable by the user. For example, the user may direct the optimization tool to optimize a particular portion of the circuit design such that power, area, speed or other predefined parameters are optimized.

The optimization program may optimize the structural description representation 24 using components from a selected cell library 30 or design library 32. The optimization program may provide an optimized structural description representation, as shown at 26. In the preferred embodiment, the optimization program is the Design Compiler, commercially available from Synopsys, Inc.

The optimized structural description representation 26 may then be placed and routed using a commercially available place and route tool. In the preferred embodiment, the place and route tool is provided by Cadence Design Systems, Inc. is utilized, although other firms active in the electronic design automation (EDA) industry all sell systems similar in function to the above-mentioned Cadence tool.

The result may be stored in the circuit design database 20 as a physical implementation representation 28. Typical cell libraries include a number of representation of each component therein including a symbol representation, a schematic representation and a physical representation. This may also be true for selected components in the design library 32. The physical implementation representation 28 of the circuit design database 20 typically includes references to the physical representation of the library components referenced therein.

Figure 3:
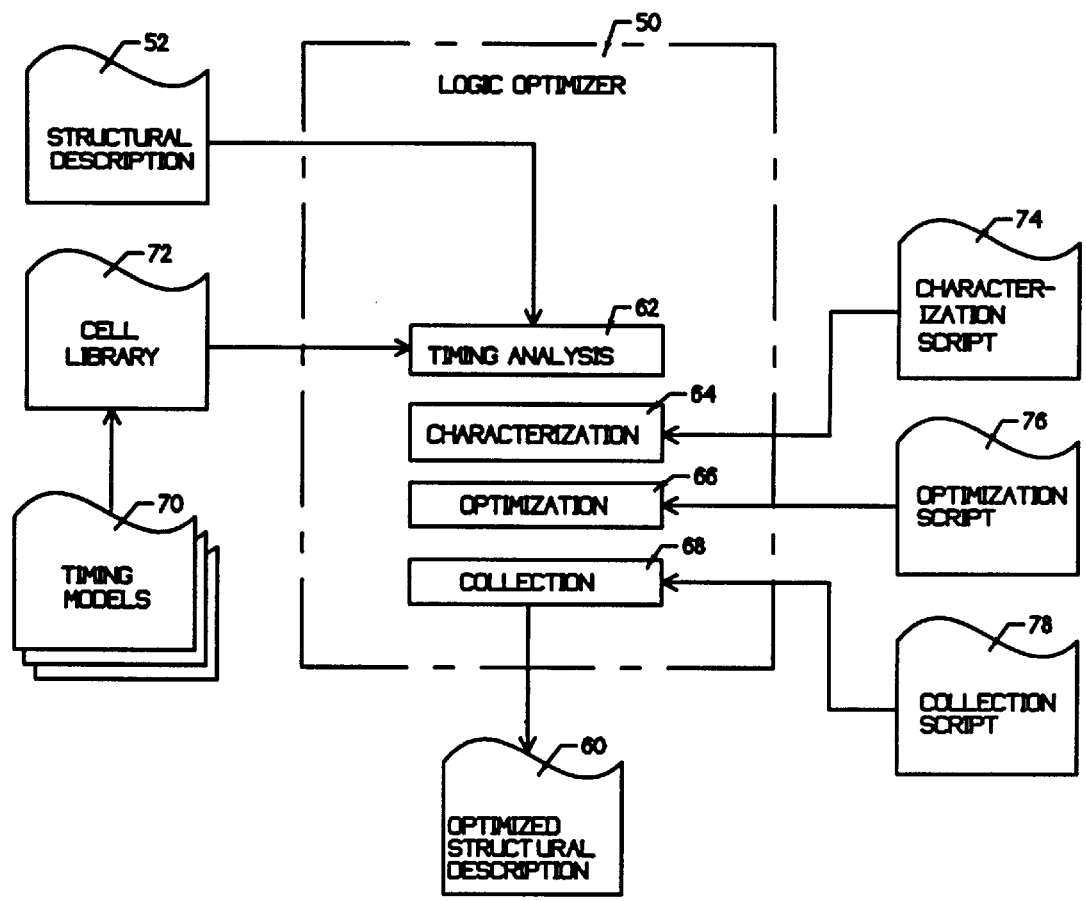
FIG. 3 is a block diagram that illustrates the operation of a standard optimization program.

FIG. 3 is a block diagram that illustrates the operation of a standard optimization tool 50. The standard optimization tool 50 may read a structural description 52 of a desired circuit design, and provide an optimized structural description 60.

More specifically, the standard optimization tool 50 may include a timing analysis block 62, a characterization block 64, a optimization block 66 and a collection block 68. The timing analysis block 62 may read the timing models for each cell within the circuit design 52 from a cell library 72. The timing analysis block 62 may then analyze the timing of the circuit design 52, and may identify the critical paths therein.

The characterization block 64 may read the results of the timing analysis block 62 and assigns various optimization parameters to selected portions of the design. For example, for those portions of the design that are to be optimized for timing, the characterization block 64 may assign timing constraints to those portions of the design that lie in the critical paths.

The timing constraints assigned by the characterization block 64 typically indicate the degree that each of the associated portions of the design must be optimized to meet the desired timing goals of the overall design. In addition, the user may supply various optimization parameters to help control the optimization of the design. For example, the user may identify various blocks that are to be optimized for performance, power, etc., or not optimized at all.

Optimization block 66 may read the timing constraints, and attempt to optimize the design such that all of the timing constraints assigned by the characterization block 64 are satisfied. During optimization, the optimization block 66 may, for example, eliminate redundant logic, minimize logic implementation, increase the power of selected cells to improve performance, etc.

Because each module in a circuit design may be separately characterized and optimized, the collection block 68 may be used to collect the various optimized modules, and write the optimized modules into a single optimized circuit design 60.

The characterization block 64, optimization block 66 and collection block 68 may be controlled by a number of optimization scripts including a characterization script 74, an optimization script 76 and a collection script 78, respectively. Each of these scripts may include a number of commands, which may be sequentially executed by the logic optimizer tool 50.

Figure 4:
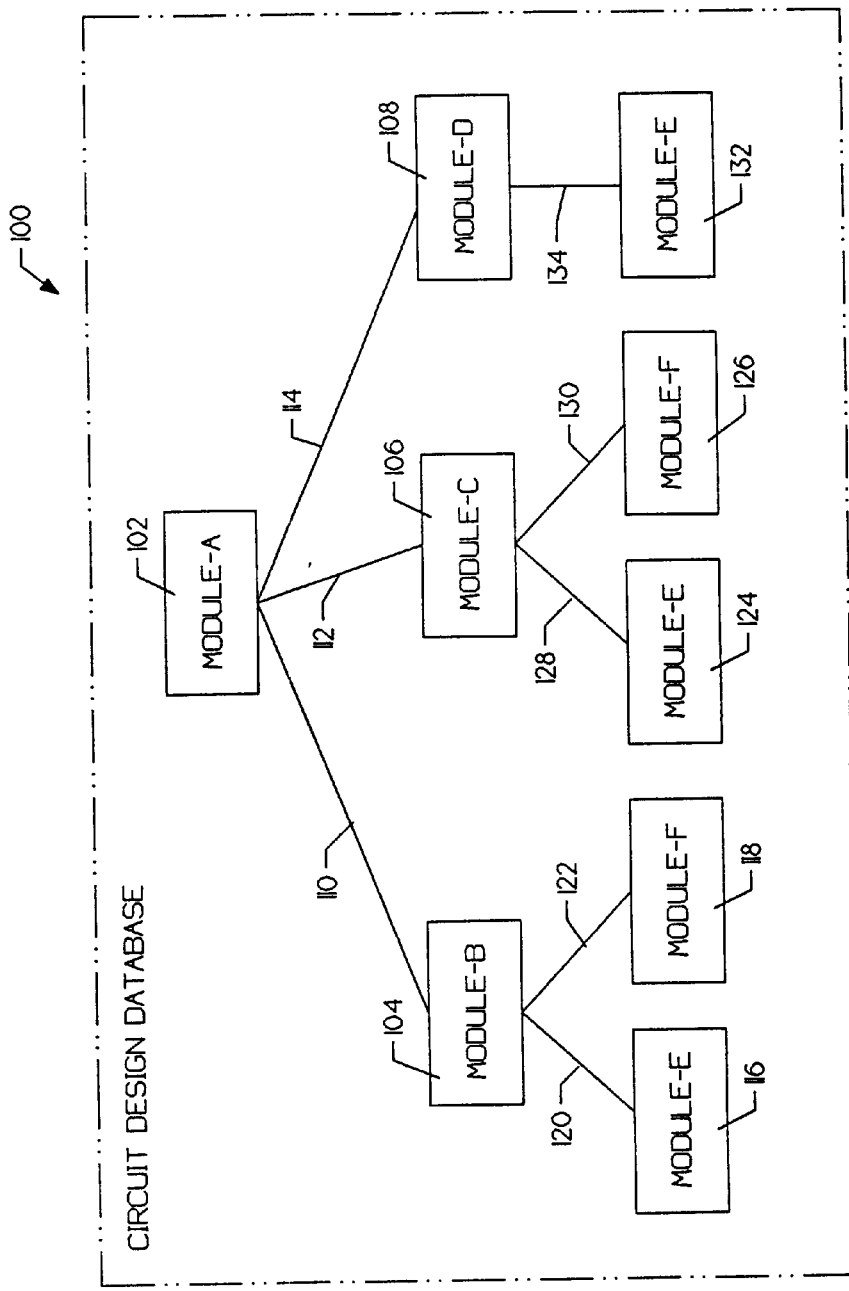
FIG. 4 is a block diagram showing a typical circuit design hierarchy, including a number of hierarchical circuit modules.

FIG. 4 is a block diagram showing a typical circuit design hierarchy, including a number of hierarchical circuit modules. The diagram is generally shown at 100. A top level module-A 102 is provided, and may represent the top hierarchial level in the exemplary circuit design database. Module-A 102 may include references to module-B 104, module-C 106, and module-D 108 as shown at 110, 112 and 114, respectively. Module-B 104, module-C 106, and module-D 108 represent the next lower level of design hierarchy in the circuit design database.

Module-B 104 may include references to module-E 116 and module-F 118 as shown at 120 and 122, respectively. Similarly, module-C 106 may include references to module-E 124 and module-F 126, as shown at 128 and 130, respectively. Finally, module-D 108 may include a reference to module-E 132, as shown at 134. Modules 116, 118, 124, 126 and 132 represent the lowest level in the design hierarchy of the circuit design database, and may be "leaf cells". That is, modules 116, 118, 124, 126 and 132 may be components from a vendor provided cell library.

It is noted that the same module, for example module-E, may be referenced by module-B 104, module-C 106, and module-D 108. To distinguish module-E 116, module-E 124 and module-E 132 from one another, a unique instance name may be provided, thereby allowing each module to be uniquely identified. Similarly, module-F 118 and module-F 126 may be provided with a unique instance name.

It is recognized that in practice, the circuit design database is typically much more complex, containing many more levels of design hierarchy and thousands of modules. That is, the circuit design database shown in FIG. 3 is only presented to illustrate the basic structure of a typical design database.

During the characterization step, the logic optimizer tool may identify all modules that interface with the selected module, and identify the timing paths therebetween. When a path is identified which may violate the timing requirements of the design, the characterization step may assign timing constraints to the selected module. For example, if a path extends from a source state device in a remote module to a destination state device in the selected local module, and the propagation time of that path is longer than a predetermined timing specification, the characterization step may allocate a portion of the overrun to the remote module and a portion of the overrun to the selected local module.

During optimization of the selected local module, the optimizer tool may attempt to optimize the logic in the selected local module such that the overrun allocated thereto may be overcome. Likewise, during optimization of the remote module, the optimizer tool may attempt to optimize the logic in the remote module such that the overrun allocated thereto may be overcome.

Because of the size of many of today's circuit designs, the characterization step and the optimization step may only be executed on a single module or set of modules within a given data processing system. That is, the circuit designer may select a particular module within the overall circuit design, and performs a characterization run and an optimization run thereon. For example, the circuit designer may elect to characterize and then optimize module-E 116, module-F 118, module-B 104, module-C 106. module-D 108 and module-A 102, and in that order.

When multiple data processing systems are utilized, however, some of the modules may be characterized and/or optimized on a first one of the data processing systems while other modules may be characterized and/or optimized on a second one of the data processing systems. For example, module-E 116 may be characterized on the first data processing system while module-F 118 may be characterized or optimized on the second data processing system. Similarly, module-B 104 may be characterized on the first data processing system while module-C 106 may be optimized on the second data processing system. One can readily see that the time required to optimize a circuit design having a number of modules may be reduced by using a number of data processing systems running in parallel.

Figure 5:
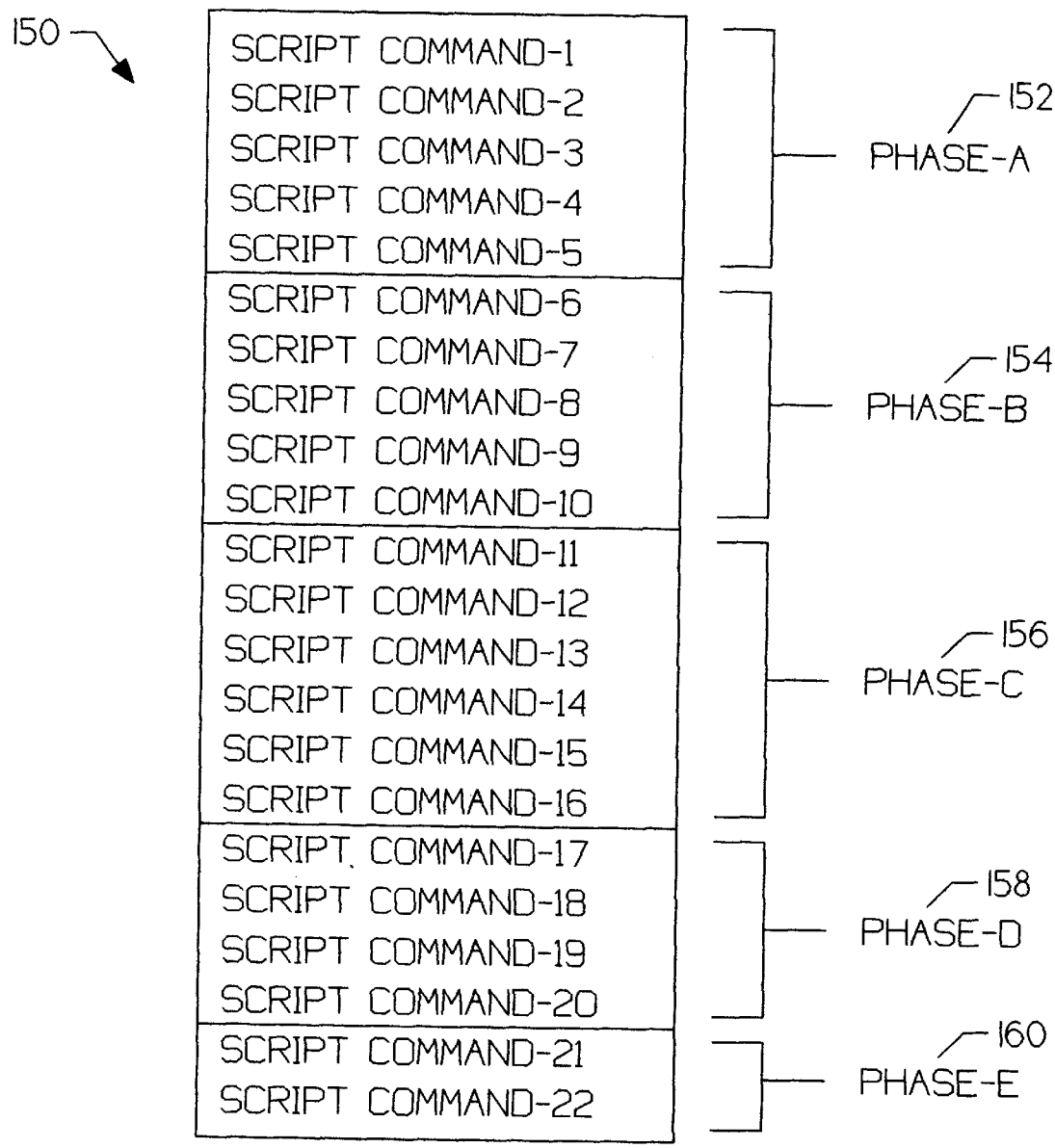
FIG. 5 illustrates an optimization script including a number of sequentially executed script commands, and the grouping of the script commands into a number of phases.

FIG. 5 illustrates an optimization script including a number of sequentially executed script commands, and the grouping of the script commands into a number of phases. As indicated above, each of the characterization, optimization and collection steps are typically controlled by a corresponding optimization script (see FIG. 3). An exemplary script is shown generally at 150, and may include a characterization script, an optimization script and/or a collection script. Each script 150 typically includes a number of sequentially executed script commands, as shown. In accordance with the present invention, the number of script commands may be grouped into a number of phases. For example, script commands 1–5 may be grouped into a phase-A 152, script commands 6–10 may be grouped into a phase-B 154, and so on. Preferably, the script commands are grouped such that each of the corresponding phases accomplishes one or more specific tasks.

Figure 6:
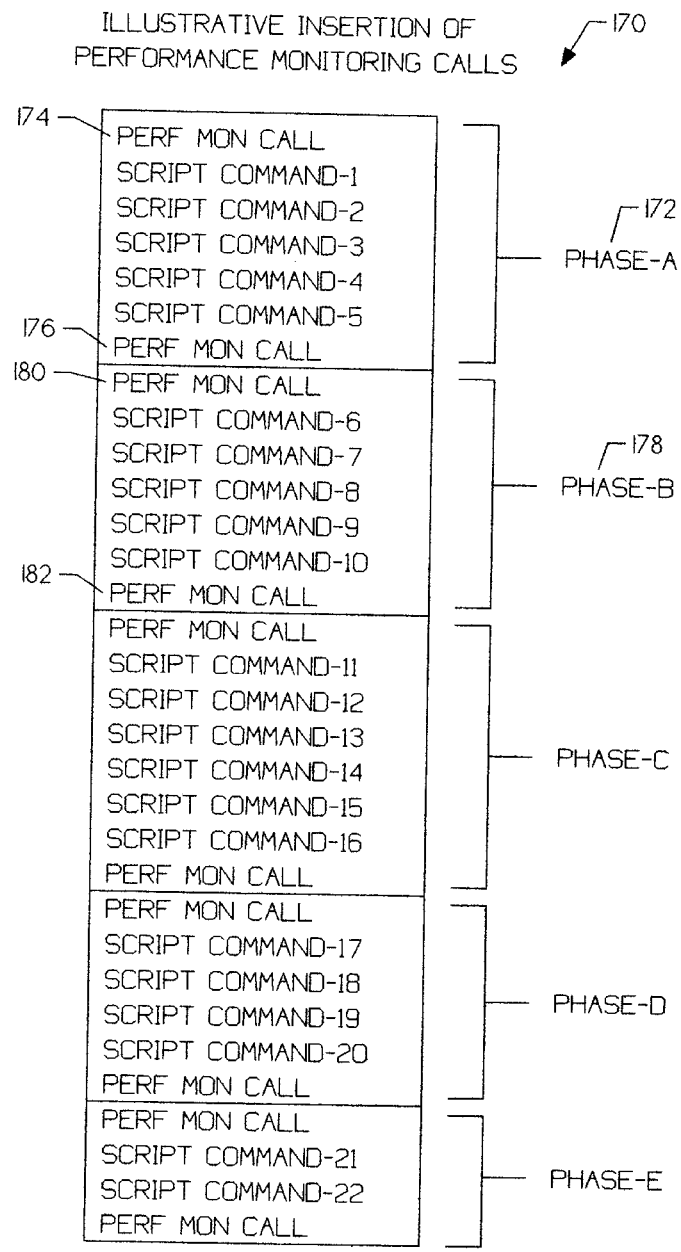
FIG. 6 illustrates an optimization script with performance monitoring calls inserted therein.

FIG. 6 illustrates an optimization script with performance monitoring calls inserted therein. To monitor the performance of each of the phases discussed above with reference to FIG. 5, the present invention contemplates inserting a number of performance monitoring calls into each phase of the optimization script. The performance monitoring calls may be a single performance monitoring command or a group of performance monitoring commands. In the illustrative embodiment shown, a performance monitoring call 174 is inserted at the beginning of phase-A 172, and a performance monitoring call 176 is inserted at the end of phase-A 172. Each of the other phases may also have a performance monitor call inserted at the beginning and end thereof, as shown.

In a preferred embodiment, each of the performance monitoring calls may provide a date stamp when executed. Thus, as the optimization script 170 is executed, a date stamp may be provided at the beginning and end of each phase. This may allow a circuit designer to determine the elapse processing time consumed by each phase.

It is recognized that the performance monitoring call at the end of a particular phase, for example phase-A, and the performance monitoring call at the beginning of the following phase, for example phase-B, may not both be required. That is, performance monitoring call 176 and performance monitoring call 180 may be combined into a single performance monitoring call. However, and as explained below, having both performance monitoring calls 176 and 180 may have certain advantages, particularly when multiple data processing systems are used to characterize and/or optimize an overall circuit design.

Figure 7:
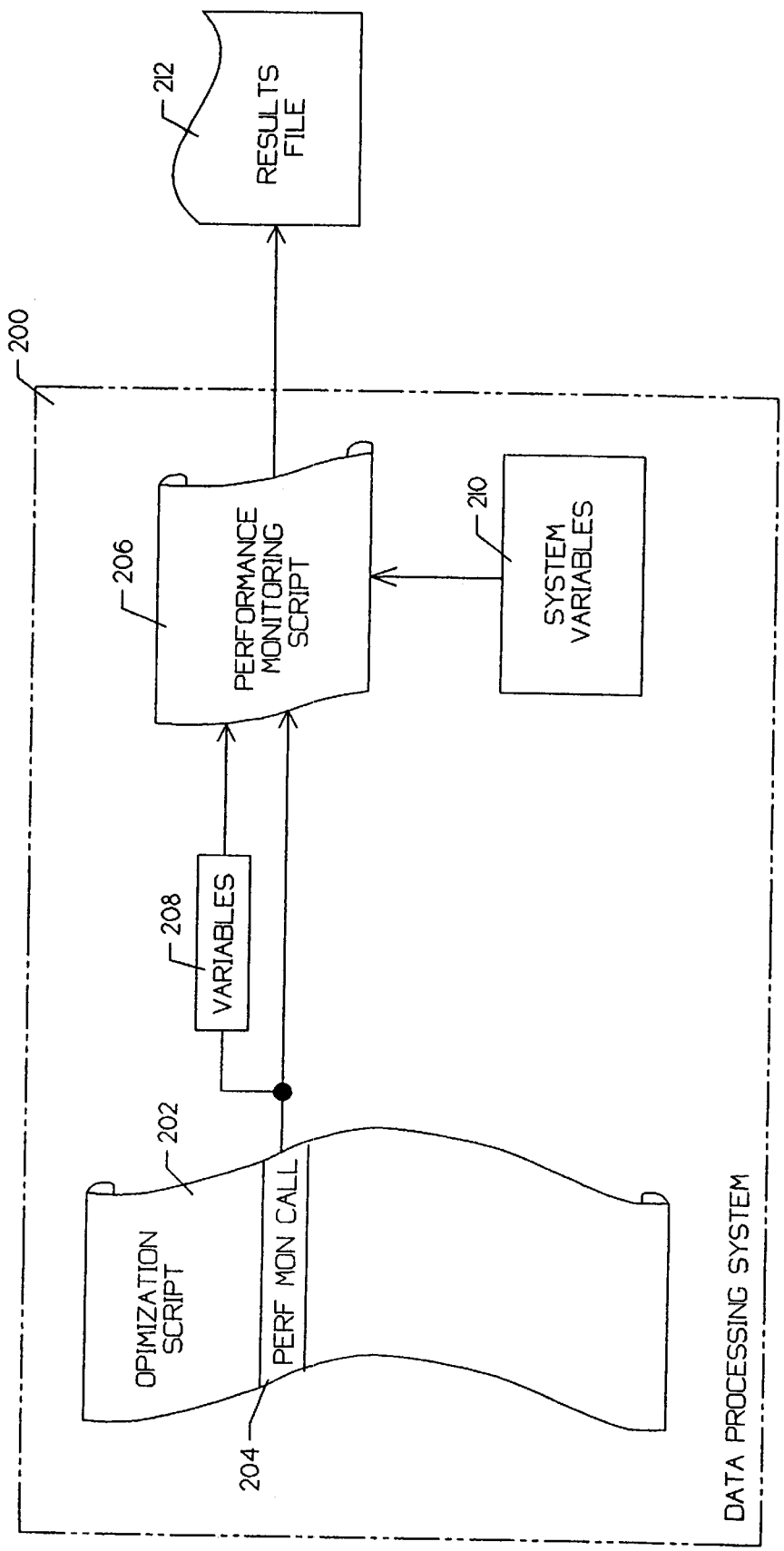
FIG. 7 is a block diagram showing the execution of an exemplary performance monitoring call within a data processing system.

FIG. 7 is a block diagram showing the execution of an exemplary performance monitoring call within a data processing system. The data processing system is generally shown at 200, and may execute an optimization script 202. As discussed with reference to FIG. 6, a number of performance monitoring calls may be inserted into the optimization script 202. One such performance monitoring call is shown at 204.

When performance monitoring call 204 is executed, and in accordance with an exemplary embodiment of the present invention, a performance monitoring script 206 is executed. The performance monitoring call 204 may provide a number of variables 208 to performance monitoring script 206, as shown. Variables 208 may be set by the optimization script, or by the user when inserting the performance monitoring call 204 into the optimization script 202. For example, performance monitoring call 204 may identify the corresponding phase, and whether the performance monitoring call 204 is positioned at the beginning or end of the corresponding phase. Other information that may be provided includes the design name, module name, the optimization pass, a run identification, etc. (see FIG. 10). This information may be passed to the performance monitoring script 206, as shown.

Performance monitoring script 206 may read the information provided by the performance monitoring call 204, and may further read a number of system variables, including the current date and time. Performance monitoring script 206 may then format an entry, and provide the entry to a results file 212. This process may occur for each performance monitoring call 204 in the optimization script 202.

Figure 8:
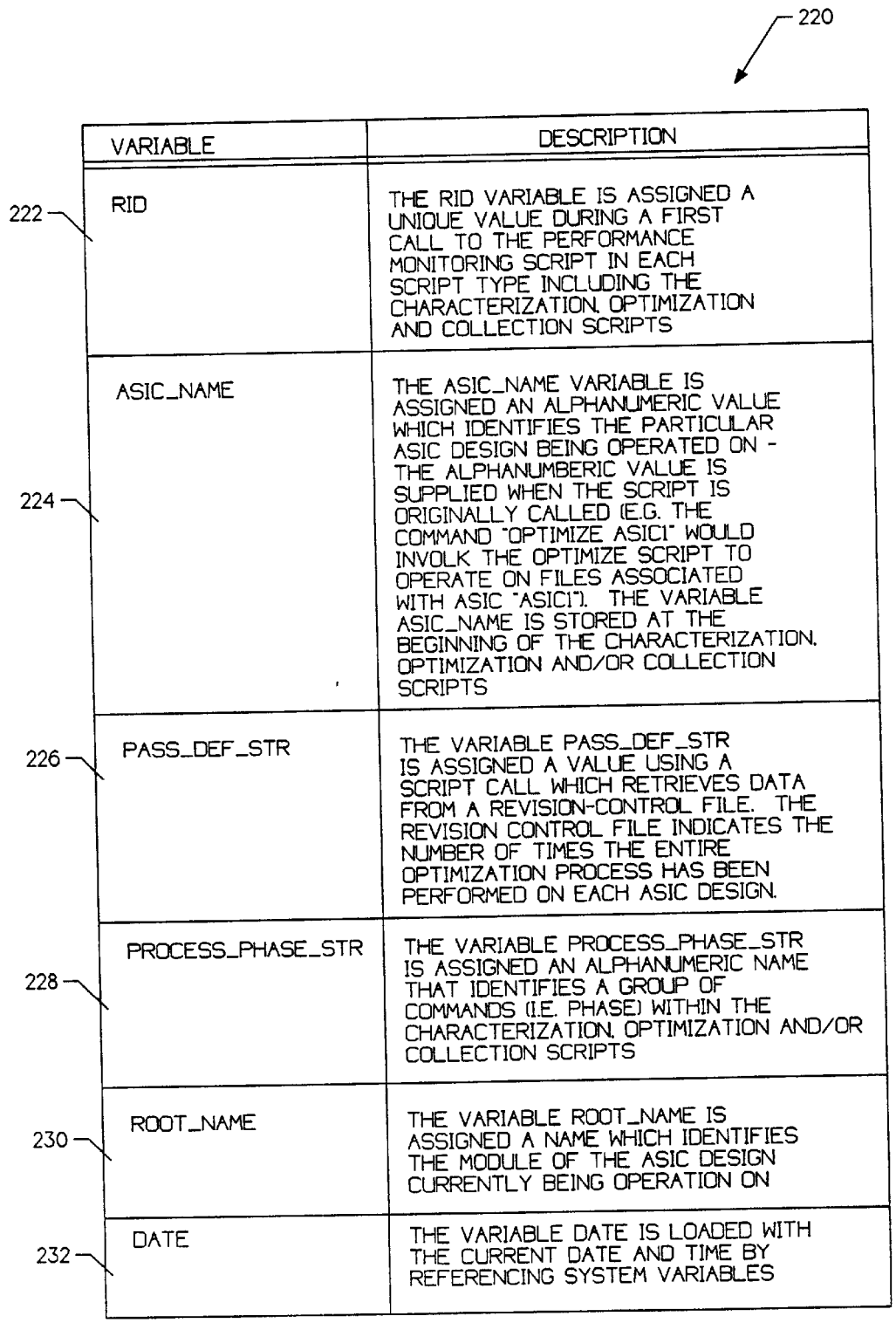
FIG. 8 is a table showing illustrative fields that are stored by selected performance monitoring commands.

FIG. 8 is a table showing illustrative fields that are stored by selected performance monitoring commands. The table is generally shown at 220, wherein a number of variables are included in the left-hand column and a description of the corresponding variables are shown in the right-hand column. The variable RID 222 is assigned a unique value during a first call to the performance monitoring script 206 (see FIG. 7). The RID, or run identification, is used to uniquely identify a particular optimization run.

The ASIC_name variable 224 is assigned an alpha-numeric value which identifies the particular ASIC design being operated upon. The alpha-numeric value is supplied when the performance monitoring script 206 is originally called (for example, the command "optimize ASIC 1" would invoke the optimized script to operate on files associated with the design "ASIC 1"). The ASIC_name variable is stored at the beginning of the characterization, optimization and/or collection scripts.

The pass_def_str variable 226 is assigned a value using a separate script call which retrieves data from a revision-control file. The revision-control file indicates the number of times the entire optimization process has been performed on each circuit design.

The process_phase_str variable 228 is assigned an alpha-numeric name that identifies a corresponding group of commands (e.g., phases) within the characterization, optimization and/or collection scripts.

The root_name variable 230 is assigned a name which identifies the module of the circuit design that is currently being operated upon.

The date variable 232 is loaded with the current date and time by referencing system variables 210 (see, FIG. 7).

The above-referenced variables may be used by the performance monitoring script 206 (see, FIG. 7) to generate a corresponding entry in the results file 212 (see, FIG. 10).

Figure 9:
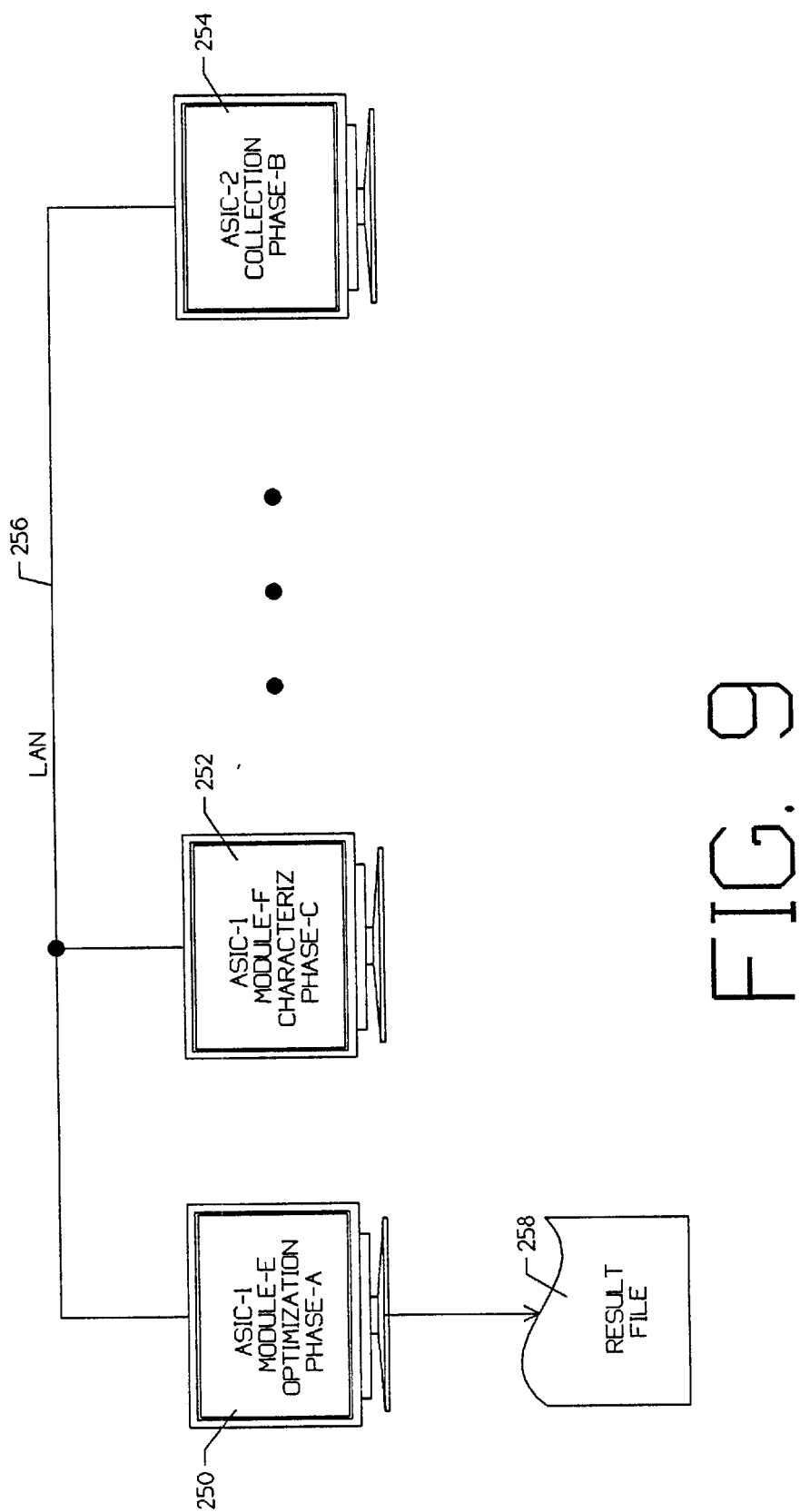
FIG. 9 is a block diagram showing a number of data processing systems coupled together via a LAN, with the results from each data processing system being stored to a single results file.

FIG. 9 is a block diagram showing a number of data processing systems coupled together via a LAN or the like, with the results from each data processing system being stored to a single results file. In the illustrative diagram, a first data processing system is shown at 250, and is executing a phase-A portion of an optimization script on module-E of a circuit design entitled ASIC-1. A second data processing system is shown at 252, and is executing a phase-C portion of a characterization script on module-F of the circuit design entitled ASIC-1. A third data processing system is shown at 254, and is executing a phase-B portion of a collection script for a circuit design entitled ASIC-2. The first data processing system 250, the second data processing system 252, and the third data processing system 254 are all coupled together in a network via a LAN 256, as shown. In such a network, each data processing system 250, 252 and 254 may store the corresponding results to a single results file 258. This may allow all of the results for a particular circuit design, or multiple circuit designs, to be stored in a single location, rather than in a number of files scattered throughout the network. However, in this configuration, the order of the entries in the results file 258 may not correspond to the order in which a design would logically be optimized. For example, the first entry in the results file may be provided by the first data processing system 250, and may correspond to the end of phase-A of the optimization run for module-E of circuit design ASIC-1. The next entry may be provided by the second data processing system 252, and may correspond to the beginning of phase-C of the characterization script for module-F of the circuit design ASIC-1. Finally, the next entry may be provided by the third data processing system 254, and may correspond to the end of phase-B of the collection script for the circuit design ASIC-2. Thus, the results for different phases and for the various modules may not be in any logical order, but rather may be in the order that the modules were processed by the number of data processing systems 250, 252, and 254.

The present invention contemplates providing an assembling capability for assembling selected entries from the results file 258. In a preferred embodiment, the circuit designer may select which phase, module, circuit design or other field that is desired, and a search capability may search the result file 258 and select those entries that have fields with values that match the selected fields. The assembling capability may then provide those entries to an output file for later review or processing. In addition, it is contemplated that the assembling capability may sort the result file 258 in accordance with the selected fields.

FIG. 10 is a table showing the entries and fields of an exemplary results file. An exemplary results file entry is shown at 270, and may include a date field, an ASIC field, a pass field, a design field, a phase field, and a run ID field. As indicated above, the date field may be provided by the performance monitoring script 206 (see, FIG. 7) by reading a number of system variables. The ASIC field, the pass field, the design field, the phase field, and the run ID field may be all assembled using variables provided by the performance monitoring call 204 (see, FIGS. 7–8).

An exemplary results file is shown at 272, and may include a number of entries. Each entry may include a number of fields, as described above. For example, the first entry 274 is shown having a date field, an ASIC field, a pass field, a phase field, a design field, and a run ID field. It is noted that in the exemplary embodiment, the phase field identifies the particular script (optimization, characterization or collection), the starting or beginning location of the particular performance monitor call within the phase, and the phase itself.

Figure 11:
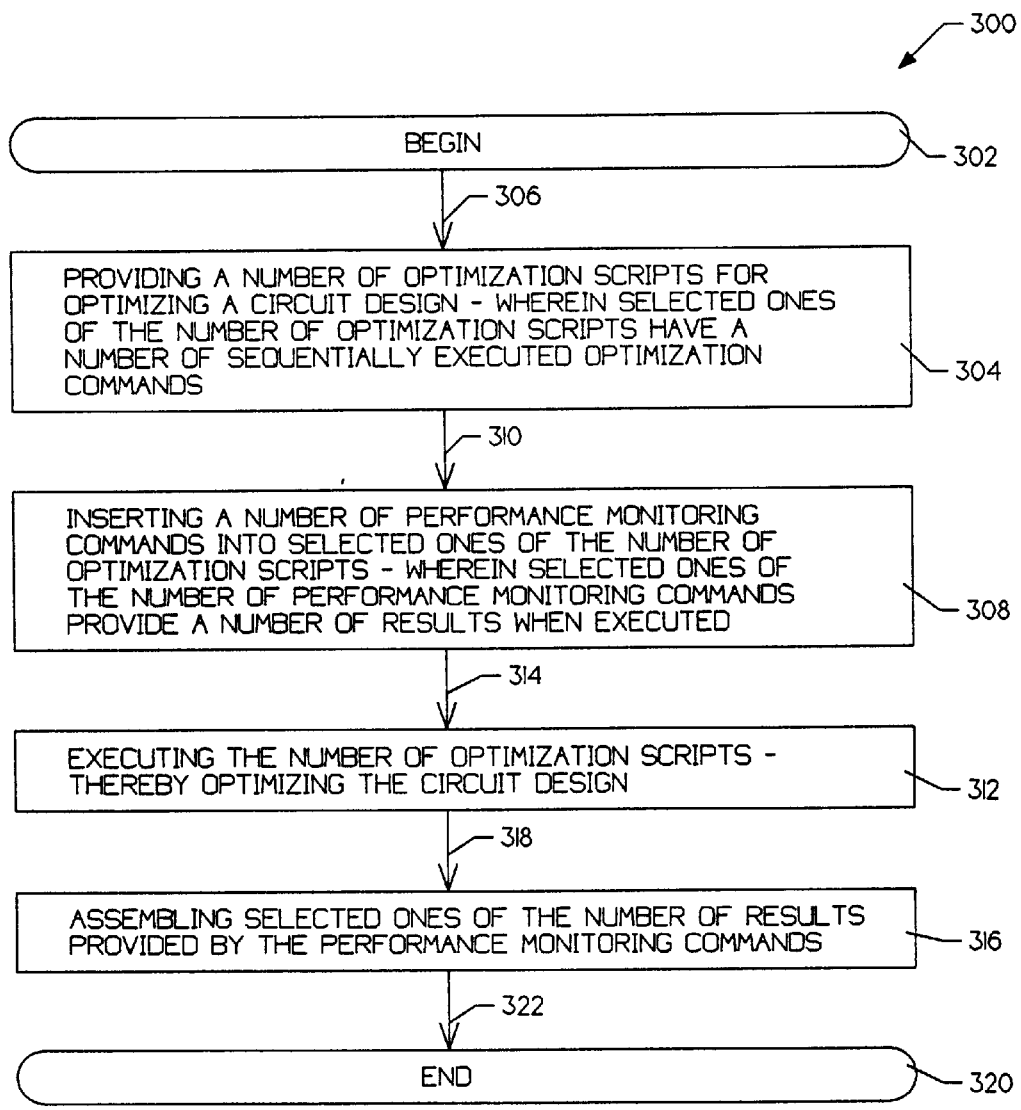
FIG. 11 is a flow diagram showing a first exemplary method of the present invention.

FIG. 11 is a flow diagram showing a first exemplary method of the present invention. The algorithm is generally shown at 300 and is entered at element 302. Control is passed to element 304 via interface 306. Element 304 provides a number of optimization scripts for optimizing a circuit design. Selected ones of the number of optimization scripts may have a number of sequentially executed optimization commands. Control is then passed to element 308 via interface 310. Element 308 inserts a number of performance monitoring commands into selected ones of the number of optimization scripts. Selected ones of the number of performance monitoring commands may provide a number of results when executed. Control is then passed to element 312 via interface 314. Element 312 executes the number of optimization scripts, thereby optimizing the circuit design. Control is then passed to element 316 via interface 318. Element 316 assembles selected ones of the number of results provided by the performance monitoring commands. Control is then passed to element 320 via interface 322, wherein the algorithm is exited.

Figure 12:
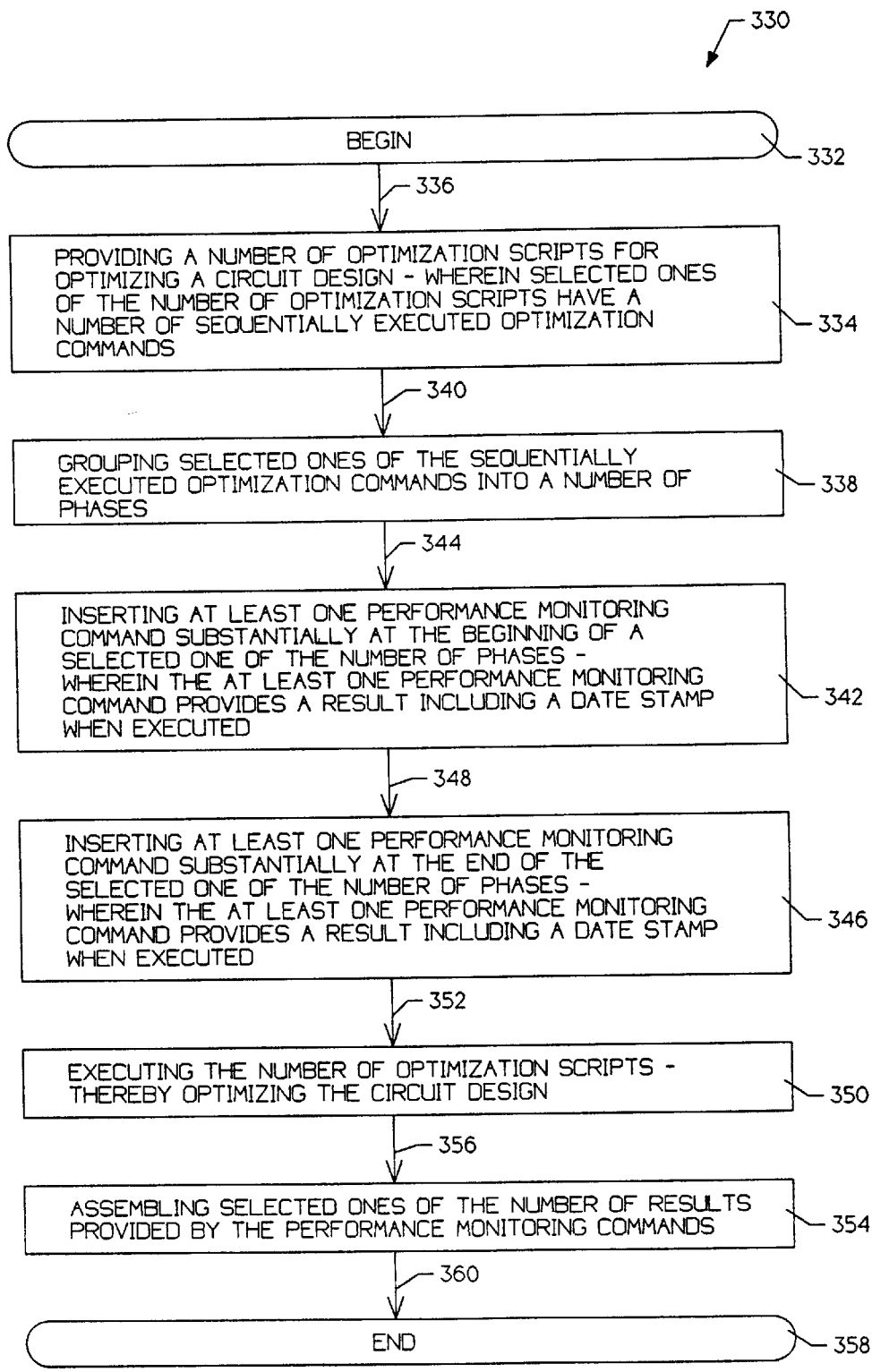
FIG. 12 is a flow diagram showing a second exemplary method of the present invention.

FIG. 12 is a flow diagram showing a second exemplary method of the present invention. The algorithm is generally shown at 330, and is entered at element 332. Control is passed to element 334 via interface 336. Element 334 provides a number of optimization scripts for optimizing a circuit design. Selected ones of the number of optimization scripts have a number of sequentially executed optimization commands. Control is then passed to element 338 via interface 340. Element 338 groups selected ones of the sequentially executed optimization commands into a number of phases. Control is then passed to element 342 via interface 344. Element 342 inserts at least one performance monitoring command substantially at the beginning of the selected one of the number of phases, wherein the at least one performance monitoring command provides a result including a date stamp when executed. Control is then passed to element 346 via interface 348. Element 346 inserts at least one performance monitoring command substantially at the end of the selected one of the number of phases, wherein the at least one performance monitoring command provides a result including a date stamp when executed. Control is then passed to element 350 via interface 352. Element 350 executes the number of optimization scripts, thereby optimizing the circuit design. Control is then passed to element 354 via interface 356. Element 354 assembles selected ones of the number of results provided by the performance monitoring commands. Control is then passed to element 358 via interface 360, wherein the algorithm is exited.

Figure 13:
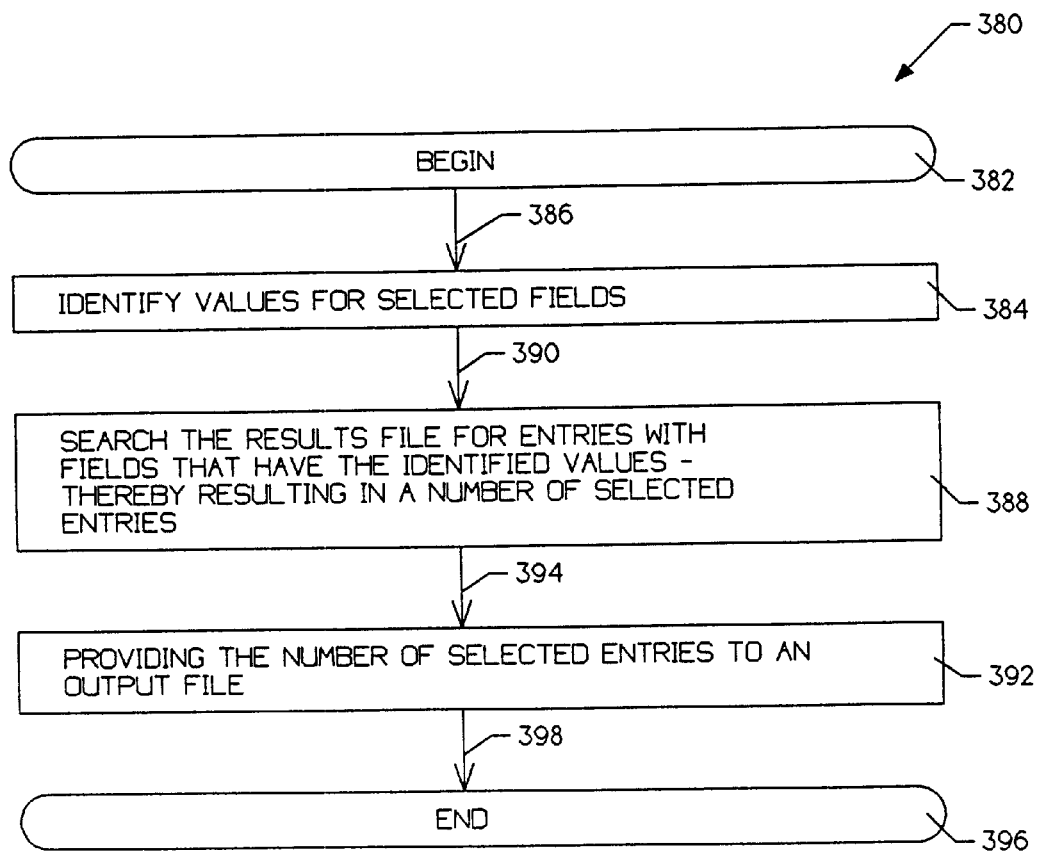
FIG. 13 is a flow diagram showing a third exemplary method of the present invention, focusing particularly on the assembly of selected entries of the results file.

FIG. 13 is a flow diagram showing a third exemplary method of the present invention, focusing particularly on the assembly of selected entries of the results file. The algorithm is generally shown at 380, and is entered at element 382. Control is passed to element 384 via interface 386. Element 384 identifies values for selected fields. In a preferred embodiment, this is done by a circuit designer. Control is then passed to element 388 via interface 390. Element 388 searches the results file for entries with fields that have the identified values, thereby resulting in a number of selected entries. Control is then passed to element 392 via interface 394. Element 392 provides the number of selected entries to an output file. Control is then passed to element 396 via interface 398, wherein the algorithm is exited.

Figure 14:
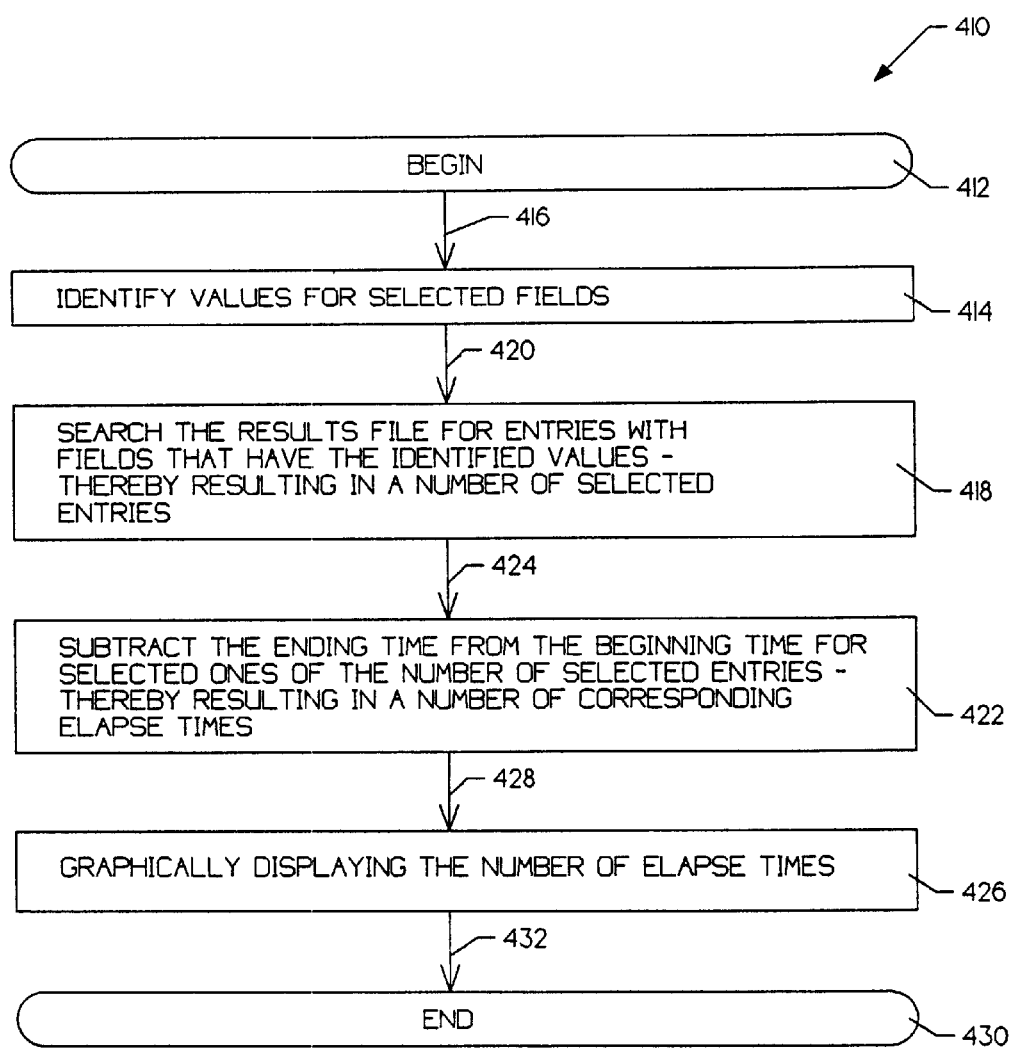
FIG. 14 is a flow diagram showing a fourth exemplary method of the present invention, focusing particularly on the assembly of selected entries of the results file.

FIG. 14 is a flow diagram showing a fourth exemplary method of the present invention, focusing particularly on the assembly of selected entries of the results file. The algorithm is generally shown at 410, and is entered at element 412.

Control is passed to element 414 via interface 416. Element 414 identifies values for selected fields. In a preferred embodiment, this is done by a circuit designer. Control is then passed to element 418 via interface 420. Element 418 searches the results file for entries with fields that have the identified values, thereby resulting in a number of selected entries. Control is then passed to element 422 via interface 424. Element 422 subtracts the ending time from the beginning time for selected ones of the number of selected entries, thereby resulting in a number of corresponding elapsed times. Control is then passed to element 426 via interface 428. Element 426 graphically displays the number of elapsed times. Control is then passed to element 430 via interface 432, wherein the algorithm is exited.

Figure 15:
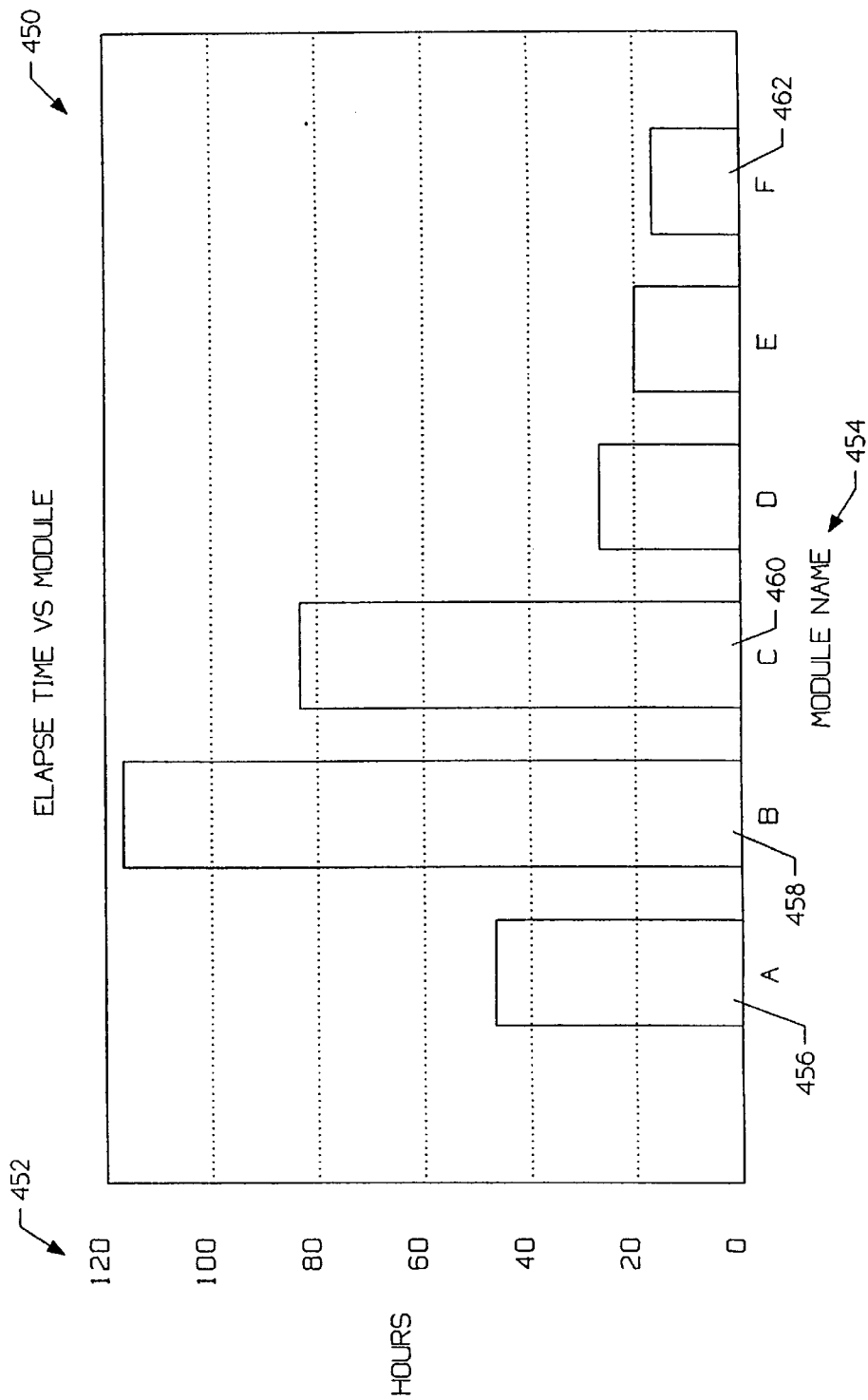
FIG. 15 is an exemplary graphical output of the present invention, showing the elapse processing time vs. module name.

FIG. 15 is an exemplary graphical output of the present invention, showing the elapse processing time versus module name. The graphical output is generally shown at 450, and displays the number of processing hours as shown at 452 along the y axis, and the module names as shown at 454 along the x axis. For illustration, the module names correspond to the modules shown in FIG. 4. As can be readily seen from the graphical output 450, module-B and module-C may consume an inordinate amount of processing time. This may be brought to the circuit designer's attention, wherein there may be ways to circumvent such performance related problems, including changing the hierarchy of the design.

Figure 16:
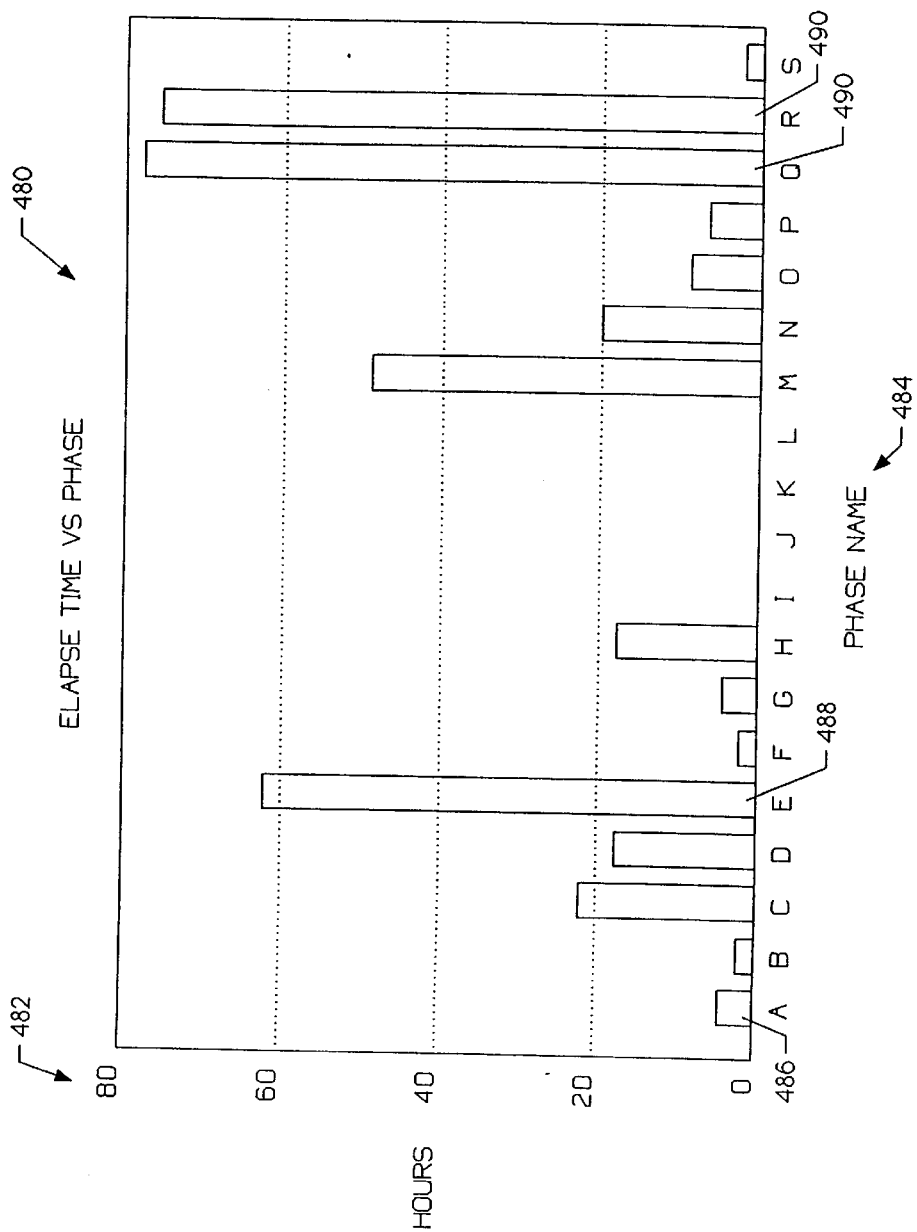
FIG. 16 is an exemplary graphical output of the present invention, showing the elapse processing time vs. phase name.

FIG. 16 is an exemplary graphical output of the present invention, showing the elapse processing time versus phase name. The graphical output is generally shown at 480, and includes the number of processing hours as shown at 482 along the y axis, and the phase name as shown at 484 along the x axis. Upon reviewing the graphical output 480, the circuit designer may determine that phase E 488, phase Q 490 and phase R 492 may consume an inordinate amount of processing time. Once brought to the circuit designer's attention, the circuit designer may take steps to circumvent the performance related problems. This may substantially decrease the overall time and cost required for performing the circuit optimization process, particularly for large circuit designs.

Figure 17:
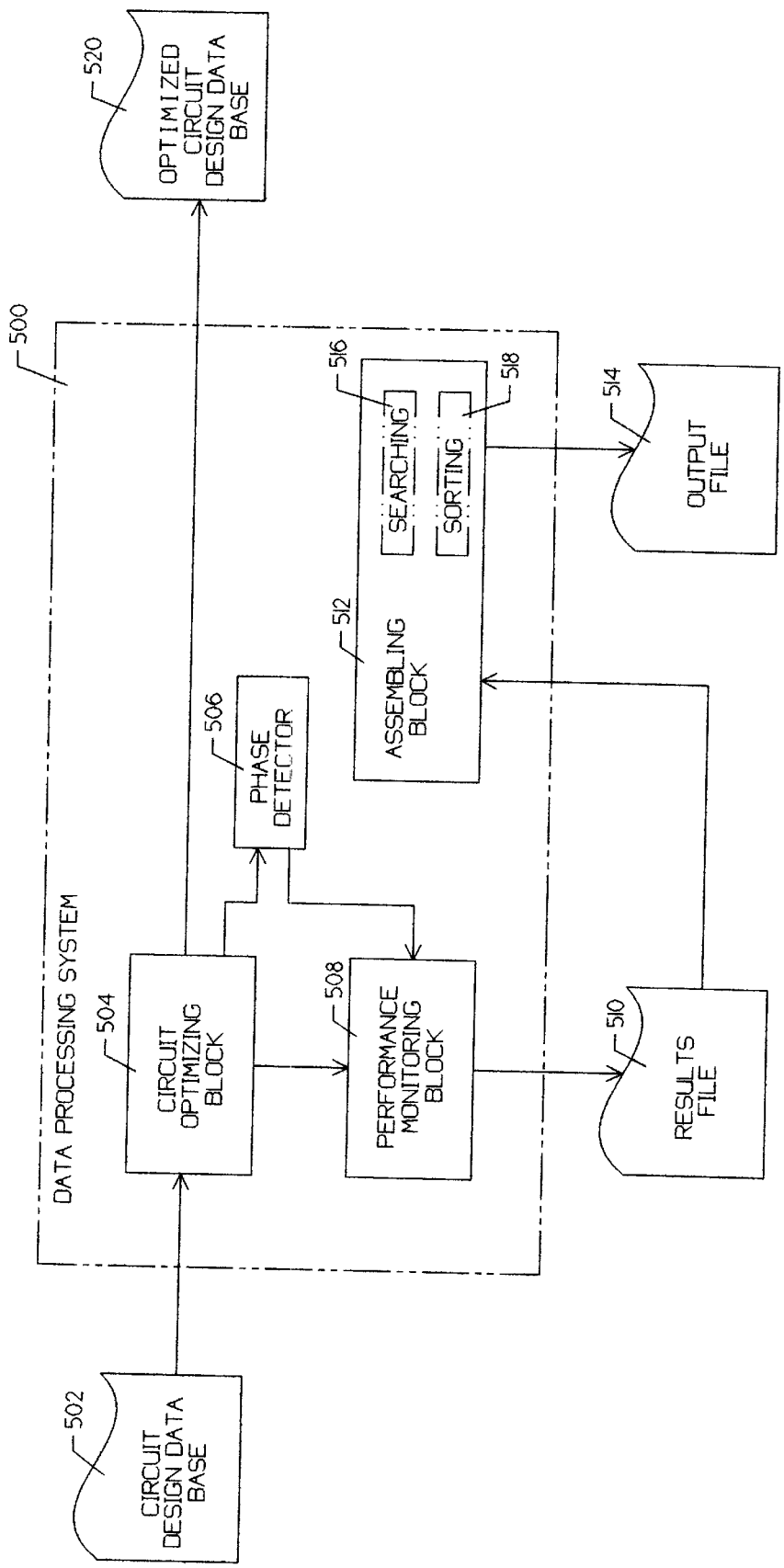
FIG. 17 is an exemplary data processing system in accordance with the present invention.

FIG. 17 is an exemplary data processing system in accordance with the present invention. The data processing system is shown at 500 and may include a circuit optimizing block 504, a phase detector 506, a performance monitoring block 508, and an assembling block 512. The circuit optimizing block 504 may read the circuit design database 502, as shown. The circuit optimizing block 504 may then optimize the circuit design database using a number of optimization scripts (not shown). The number of optimization scripts may include a number of sequentially executed optimization commands that may be grouped into a number of phases. Phase detector 506 may detect the execution of each of the phases and may notify performance monitoring block 508 thereof. Performance monitoring block 508 may record certain predetermined information regarding each phase, including a date stamp to results file 510. Circuit optimizing block 504 may proceed and provide an optimized circuit design database 520, as shown.

Assembling block 512 may read results file 510, assemble selected entries, and provide the results to output file 514. Assembling block 512 may select those entries in results file 510 that match a number of predetermined characteristics. These predetermined characteristics may be provided by a circuit designer and may include the phase, the module, the design, and/or any other field that is desired. Assembling block 512 may include a searching capability 516 for searching the results file 510 for those entries that have characteristics that match the characteristics provided. In a preferred embodiment, the characteristics are provided in a number of fields, and thus, the searching capability 516 may search the results file 510 for entries that have fields with values that match the selected fields. Assembling block 512 may then provide those entries to the output file 514 for later review and/or processing. In addition, it is contemplated that assembling block 512 may include a sorting capability 516 for sorting the results file 510 in accordance with the selected fields.

In addition, it is contemplated that the assembling block 512 may determine the elapsed processing time for each of the selected phases. For example, assembling block 512 may subtract the start time and the end time for selected phases recorded in the results file 510, and may record the result as in the elapse processing time in output file 514.

Finally, it is contemplated that assembling block 512 may include a display capability for displaying the selected results in a user friendly way. For example, assembling block 512 may write the output file 514 in a CSV format. The CSV format is an industry-standard format used by programs such as Harvard Graphics™ and EXCEL™ to express data tables. As such, these programs may be used to graph or otherwise display the selected results. For example, EXCEL™ may graph the elapsed time versus the corresponding phase, or the elapse time versus the corresponding module. This may provide a visual basis for easily determining which portions of the optimization process are consuming an inordinate amount of processing time, and thus, may provide a way to monitor the performance of the circuit optimization process. If performance related problems are detected, the circuit designer may circumvent the problems during the next design iteration. This may substantially decrease the overall time and cost required for performing the circuit optimization process, particularly for large circuit designs.

Having thus described the preferred embodiments of the present invention, those of skill in the art will readily appreciate that the teachings found herein may be applied to yet other embodiments within the scope of the claims hereto attached.

What is claimed is;:

1. A method for monitoring the performance of a circuit optimization program, wherein the circuit optimization program executes a number of optimization scripts to optimize a circuit design, selected ones of the optimization scripts having a number of sequentially executed optimization commands, the method comprising the steps of:

a. inserting a number of performance monitoring commands into selected ones of the number of optimization scripts, wherein selected ones of the performance monitoring commands provide a number of results when executed;

b. executing the number of optimization scripts to optimize the circuit design; and c. assembling selected ones of the number of results provided by the performance monitoring commands.

2. A method according to claim 1 wherein selected ones of the number of performance monitoring commands provide a date stamp when executed.

3. A method according to claim 2 wherein said inserting step further comprises the steps of:

a. grouping selected ones of the sequentially executed optimization commands into a number of phases; and b. inserting at least one of the selected ones of the performance monitoring commands that provide a date stamp substantially at the beginning of a selected one of the number of phases.

4. A method according to claim 2 wherein said inserting step further comprises the steps of:
   a. grouping selected ones of the sequentially executed optimization commands into a number of phases; and
   b. inserting at least one of the selected ones of the performance monitoring commands that provide a date stamp substantially at the end of a selected one of the number of phases.

5. A method according to claim 2 wherein said inserting step further comprises the steps of:
   a. grouping selected ones of the sequentially executed optimization commands into a number of phases;
   b. inserting at least one of the selected ones of the performance monitoring commands that provide a date stamp substantially at the beginning of a selected one of the number of phases; and
   c. inserting at least one of the selected ones of the performance monitoring commands that provide a date stamp substantially at the end of a selected one of the number of phases.

6. A method according to claim 5 wherein predetermined ones of the performance monitoring commands write the number of results to a results file.

7. A method according to claim 6 wherein selected ones of said number of results comprise a number of fields.

8. A method according to claim 7 wherein said assembling step further comprises searching through the results file to identify which of the number of results stored therein correspond to the execution of a selected one of the number of phases.

9. A method according to claim 8 wherein said searching step identifies which of the number of results correspond to the execution of the selected one of the number of phases by examining selected ones of the number of fields of the number of results.

10. A method according to claim 1 wherein the circuit design comprises a number of modules, and wherein said executing step sequentially executes selected ones of the number of optimization scripts on selected ones of the number of modules.

11. A method according to claim 10 wherein selected ones of the performance monitoring commands write a number of results to a results file when executed.

12. A method according to claim 11 wherein selected ones of said number of results comprise a number of fields.

13. A method according to claim 12 wherein said assembling step further comprises searching through the results file to identify which of the number of results stored therein correspond to which of the number of modules.

14. A method according to claim 13 wherein said searching step identifies which of the number of results correspond to which of the number of modules by examining selected ones of the number of fields of selected ones of the number of results.

15. A method according to claim 14 wherein said assembling step further comprises the steps of:
   a. graphing selected results recorded in the results file.

16. A method for monitoring the performance of a circuit optimization program, wherein the circuit optimization program executes a number of optimization scripts to optimize a circuit design having a number of modules, selected ones of the optimization scripts having a number of sequentially executed optimization commands, the method comprising the steps of:
   a. inserting a number of performance monitoring commands into selected ones of the number of optimization scripts, wherein selected ones of the performance monitoring commands provide a result when executed;
   b. optimizing a first one of the number of modules by executing a first selected set of the number of optimization scripts, wherein the first selected set of the number of optimization scripts write a number of first results to a results file;
   c. optimizing a second one of the number of modules by executing a second selected set of the number of optimization scripts, wherein the second selected set of the number of optimization scripts write a number of second results to the results file; and
   d. searching through the results file to identify which of the number of results stored therein correspond to the first one of the number of modules.

17. A method according to claim 16 wherein said searching step (d) includes the step of sorting selected ones of the number of first and second results in a predetermined manner.

18. A method for monitoring the performance of a circuit optimization program, wherein the circuit optimization program executes a number of optimization scripts to optimize a circuit design having a number of modules, selected ones of the optimization scripts having a number of sequentially executed optimization commands, the method comprising the steps of:
   a. inserting a number of performance monitoring commands into selected ones of the number of optimization scripts, wherein selected ones of the performance monitoring commands provide a result when executed;
   b. optimizing a first one of the number of modules by executing a first selected set of the number of optimization scripts on a first data processing system, wherein the first selected set of the number of optimization scripts write a number of first results to a results file;
   c. optimizing a second one of the number of modules by executing a second selected set of the number of optimization scripts on a second data processing system, wherein the second selected set of the number of optimization scripts write a number of second results to the results file; and
   d. searching through the results file to identify which of the number of results stored therein correspond to the first one of the number of modules, thereby identifying the number of first results.

19. Apparatus for optimizing a circuit design, comprising:
   a. data base means for providing a circuit design data base;
   b. optimizing means responsively coupled to the data base means for optimizing a number of selected portions of the circuit design;
   c. performance monitoring means coupled to said optimizing means for monitoring the performance of said optimizing means; and
   d. assembling means coupled to said optimizing means for assembling results from said optimizing means to produce an output file.

20. Apparatus according to claim 19 wherein said optimizing means comprises sequentially executing a number of optimization phases, wherein selected ones of the optimization phases include a number of optimization commands.

21. Apparatus according to claim 20 wherein said performance monitoring means monitors the performance of selected ones of the number of optimization phases.

22. Apparatus according to claim 21 wherein said performance monitoring means stores an initial time stamp corresponding to the time of execution of the beginning of a selected one of the number of optimization phases.

23. Apparatus according to claim 21 wherein said performance monitoring means stores a final time stamp corresponding to the time of execution of the end of a selected one of the number of optimization phases.

24. Apparatus according to claim 21 wherein said performance monitoring means stores an initial time stamp corresponding to the time of execution of the beginning of a selected one of the number of phases and a final time stamp corresponding to the time of execution of the end of the selected one of the number of phases.

25. Apparatus according to claim 24 wherein said performance monitoring means stores the initial time stamp and the final time stamp in a results file.

26. Apparatus according to claim 25 further comprising assembling means for assembling the results provided by said performance monitoring means.

27. Apparatus according to claim 26 wherein said assembling means subtracts the initial time stamp from the final time stamp for a selected one of the number of phases.

28. Apparatus according to claim 20 wherein said performance monitoring means provides a number of results to a results file.

29. Apparatus according to claim 28 further comprising an assembling means for assembling the results provided by said performance monitoring means.

30. Apparatus according to claim 29 wherein said optimizing means optimizes a first one of the number of phases on a first data processing system and optimizes a second one of the number of phases on a second data processing system.

31. Apparatus according to claim 30 wherein said performance monitoring means provides a number of first results to the results file for the first one of the number of phases and provides a number of second results to the results file for the second one of the number of phases.

32. Apparatus according to claim 31 further comprising searching means for searching through the results file to identify which of the number of results stored therein correspond to the execution of the first phase.

33. Apparatus according to claim 32 further comprising a sorting means for sorting the number of first results.

34. Apparatus according to claim 28 wherein said performance monitoring means provides a number of results, to the results file, which correspond to the execution of a first one of the number of phases, and provides a number of results, to the results file, which correspond to the execution of a second one of the number of phases.

35. Apparatus according to claim 34 wherein selected ones of said number of results comprise a number of fields.

36. Apparatus according to claim 35 further comprising searching means for searching through the results file to identify which of the number of results stored therein correspond to the execution of the first phase.

37. Apparatus according to claim 36 wherein said searching means identifies which of the number of results correspond to the execution of the first phase by examining selected ones of the number of fields of selected ones of the number of results.

* * * * *